FEED-FORWARD AMPLIFIER WITH FREQUENCY SHAPING

Filed April 25, 1969 2 Sheets-Sheet 1

INVENTOR
H. SEIDEL
BY
Sylvan Sherman
ATTORNEY

FEED-FORWARD AMPLIFIER WITH FREQUENCY SHAPING

Filed April 25, 1969

United States Patent Office 3,541,467
Patented Nov. 17, 1970

3,541,467

FEED-FORWARD AMPLIFIER WITH FREQUENCY SHAPING

Harold Seidel, Warren Township, Somerset County, N.J., assignor to Bell Telephone Laboratories, Incorporated, Murray Hill and Berkeley Heights, N.J., a corporation of New York Filed Apr. 25, 1969, Ser. No. 819,247
Int. Cl. H03f 3/68
U.S. Cl. 330—124 7 Claims

ABSTRACT OF THE DISCLOSURE

Distortion, including intermodulation products and noise are minimized in an amplifier by means of a time-compensated, feed-forward circuit arrangement wherein error components are accumulated in a separate error circuit and injected into the main signal wavepath at a later time and in a manner to cancel the error components in the amplified signal. A single, four-port reactive coupler is employed to couple between the main signal wavepath and the error signal wavepath. The gain characteristics of the main signal amplifier, the error amplifier and the coupler are given in terms of the amplifiers over-all gain characteristics.

This invention relates to low-noise amplifiers employing feed-forward techniques.

BACKGROUND OF THE INVENTION

In an article entitled "Error-Controlled High Power Linear Amplifiers at VHF," published in the May–June 1968 issue of the Bell System Technical Journal, pages 651–722, H. Seidel et al. describe a low-noise amplifier employing feed-forward error correction. In particular, the circuit described is particularly adapted to high-power, constant gain amplifiers.

In attempting to adopt similar techniques as a means of compensating amplifiers having frequency dependent gain characteristics, including regions of relatively low gain, it soon becomes clear that the criteria and techniques developed heretofore are no longer suitable. Clearly, an alternate approach is required.

SUMMARY OF THE INVENTION

As in the prior art, a feed-forward amplifier in accordance with the present invention recognizes the passage of time. Error is determined in relationship to a time-shifted reference signal, and is corrected in a time sequence that is compatible with the main signal. Accordingly, the feed-forward amplifier comprises two parallel wavepaths. One path, called the main signal path, includes one or more signal amplifiers and operates upon the signal to be amplified in the usual manner. The main signal amplifier is characterized by a gain-frequency response which varies as a function of frequency. A second path, called the error signal path, accumulates the errors introduced into the signal by the signal amplifier. These error components, which include both noise and intermodulation distortion, are accumulated in the error signal path at a level and in proper time and phase relationship so that they can be injected into the main signal path in a manner to cancel the error components in the main signal path.

The error signal is obtained by comparing a portion of the input signal, designated the reference signal, with a portion of the amplified main signal. In accordance with the present invention, sampling of the amplified signal is performed by means of a single reactive four-port whose power division ratio has the same frequency response as the signal amplifier.

It is a first advantage of the present invention that, unlike the prior art feed-forward amplifier, the over-all gain of the error-corrected signal is greater than the gain of the main signal amplifier.

It is a further advantage of the invention that the signal-to-noise ratio of the error-corrected amplifier signal is greater than the signal-to-noise ratio of the error amplifier.

These and other objects and advantages, the nature of the present invention, and its various features, will appear more fully upon consideration of the various illustrative embodiments now to be described in detail in connection with the accompanying drawings.

DETAILED DESCRIPTION

Figure 1:
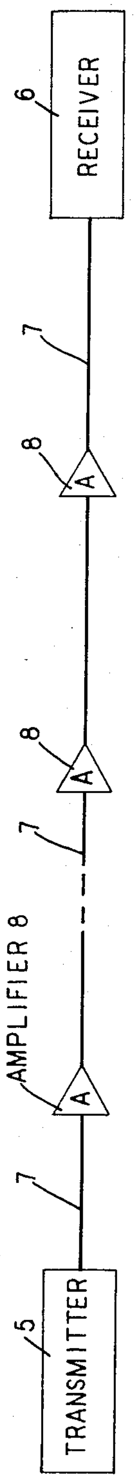
FIG. 1 shows, in block diagram, a long distance transmission system including amplifiers at spaced intervals therealong.

Referring to the drawings, FIG. 1 shows a communication system comprising a transmitter 5 and a receiver 6 connected by means of a transmission line 7. Because of the losses associated with transmission line 7, amplifiers 8 are included at regularly spaced intervals therealong.

The requirements placed upon the amplifiers will, of course, vary from system to system. One general requirement will be that they amplify the transmitted signals in a manner to compensate for the losses incurred along the transmission line. Since these losses are, typically, not uniform, the gain characteristic of each amplifier (as a function of frequency) must be shaped so as to compensate for the particular loss characteristic of the transmission line. In general, transmission losses are higher at the higher frequencies. Accordingly, the gain of the amplifiers will be higher at these higher frequencies.

Finally, the amplifiers are, advantageously, designed to be as free of distortion as is economically feasible. For example, third-order intermodulation distortion in a carrier communication system substantially limits the capacity of the system. Accordingly, any significant reduction in intermodulation distortion advantageously results in a corresponding increase in system capacity and economy.

The present invention, now to be described, relates to a low-noise, low-distortion amplifier having any arbitrary gain characteristic $F(\omega)$. Before proceeding directly, however, a related prior art amplifier, shown in FIG. 2, will be considered first.

Figure 2:
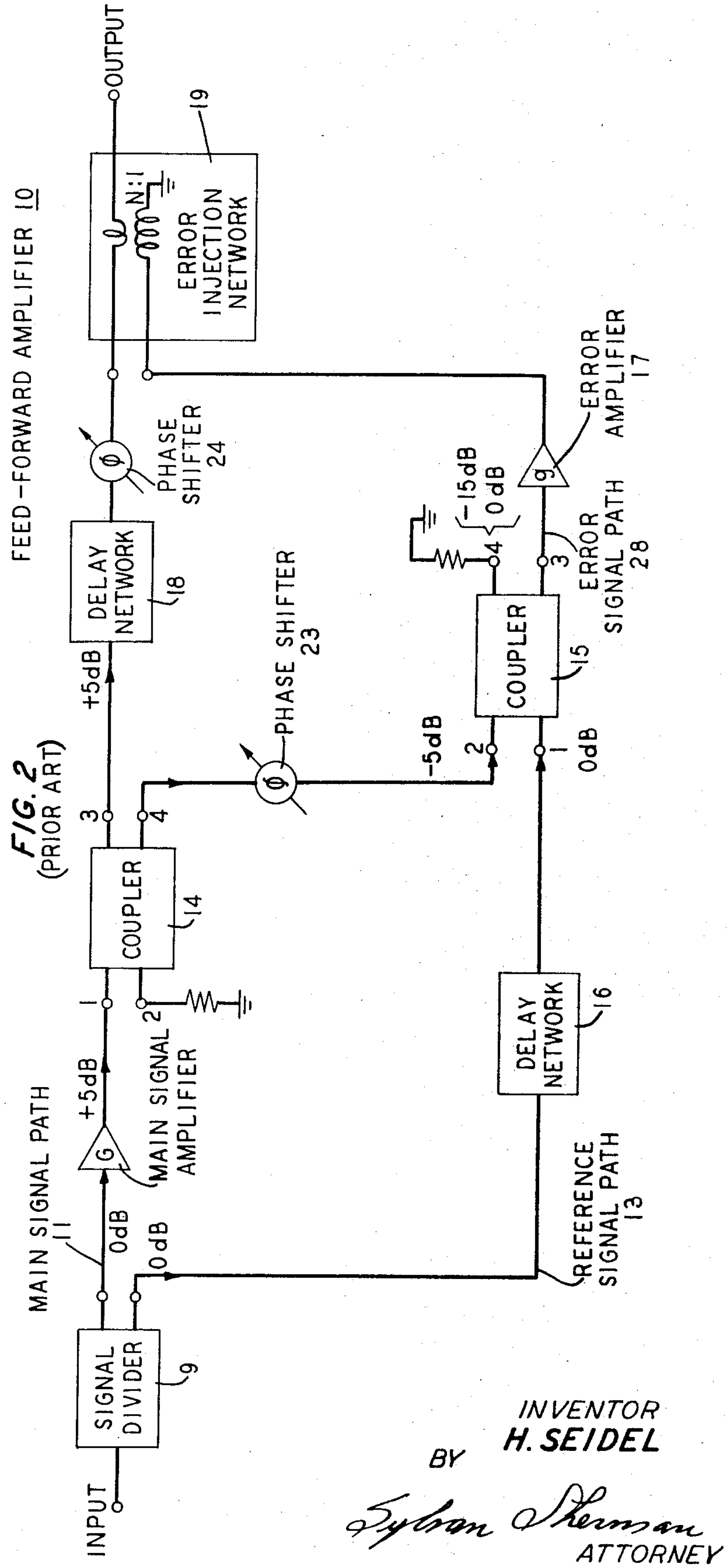
FIG. 2 (PRIOR ART)
FIG. 2, included for purposes of explanation, shows a prior art feed-forward amplifier.

FIG. 2, included for purposes of explanation and comparison, is a simplified block diagram of the prior art feed-forward amplifier described by Seidel et al. in their above-identified article. In operation, the input signal is divided into two, preferably unequal, components. The smaller component, i.e., the main signal (or simply, the signal) is directed along a main signal path 11 to a main signal amplifier 12. The other, larger component, i.e., the reference signal, is directed along a reference signal path 13, which includes a delay network 16.

The signal is amplified by amplifier 12 and a small sample of the amplified signal is coupled into an error signal path by means of directional couplers 14 and 15, where it is compared with the time-delayed reference signal. As was explained more fully in my copending application Ser. No. 692,546, filed Dec. 26, 1967, isolation of the error components introduced into the amplified signal by amplifier 12 is accomplished by adjusting the amplitudes, phases and time delays associated with the reference signal and the sampled amplified signal such that the signal components cancel, leaving only error components. Phase shifter 23, delay network 16 and couplers 14 and 15 are all suitably designed for this purpose.

The error signal thus obtained is amplified in error amplifier 17 whose gain is such that the error signal is restored to an appropriate level to cancel any error components in the main signal path that may have been introduced by signal amplifier 12. The delay introduced by error amplifier 17 is compensated for by a suitable delay network 18 in the main signal path. Phase adjustments are made in phase shifter 24. The injection of the isolated error signal into the main signal path is by means of a reactive error injection network 19. For reasons explained by Seidel et al., the injection network is an N:1 turns ratio transformer.

One of the error components sought to be eliminated by means of the above-described feed-forward technique, is the main signal amplifier noise. In a high power amplifier, this can be considerable. In the process, however, the thermal noise present in the error amplifier is substituted and, ultimately, it is the noise figure of the error amplifier that determines the over-all noise performance of the compensated amplifier. Thus, one very important advantage of the feed-forward compensation would be lost if the circuit were not adapted to minimize the noise figure of the error amplifier. In view of this, the input signal is advantageously divided unequally, with the larger signal component being coupled into the reference signal wavepath. While the gain of signal amplifier 12 must be made larger to offset this coupling loss, this increase is, in principle, irrelevant inasmuch as any resulting worsening of the noise figure in the signal path is of no consequence since the error cancellation feature of the feed-forward system simply treats the additional noise as additional error, and eliminates it.

All of the above-described considerations and factors presupposes that there is sufficient gain available in the signal amplifier to compensate for the unequal power division of the input signal and for the signal attenuation through couplers 14 and 15. The present invention, however, considers the situation wherein large amounts of gain are not available. For example, let us consider the situation where the amplifier is called upon to equalize the losses in a transmission system wherein the losses are relatively small at one end of the frequency band of interest, and large at the other end. In the specific case of the Bell System L–4 carrier system, the amplifier gain, as a function of frequency, might vary from 5 to 30 db across the band of interest. To attempt to impose the prior art design considerations upon such a system would, as will now be shown, make a complete shambles of the system. For example, let us assume that the input signal is divided equally between the main signal path and the reference signal path. We designate these two components in FIG. 1 as 0 db signals at the signal divider outputs. Assuming a 5 db gain in amplifier 12, the signal at the input port 1 to coupler 14 is +5 db. The typical coupling loss through each of the two couplers 14 and 15 is of the order of 10 db, for a total loss of 20 db. Thus, the signal coupled from the main signal path to the error amplifier is down to −15 db. The reference signal, on the other hand, is of the order of 0 db. Obviously, there can be no cancellation of the signals under these conditions unless a 15 db attenuator is added to the reference signal path. This, of course, would inject additional thermal noise into the error circuit and completely negate the possibility of realizing an improved noise figure.

Figure 3:
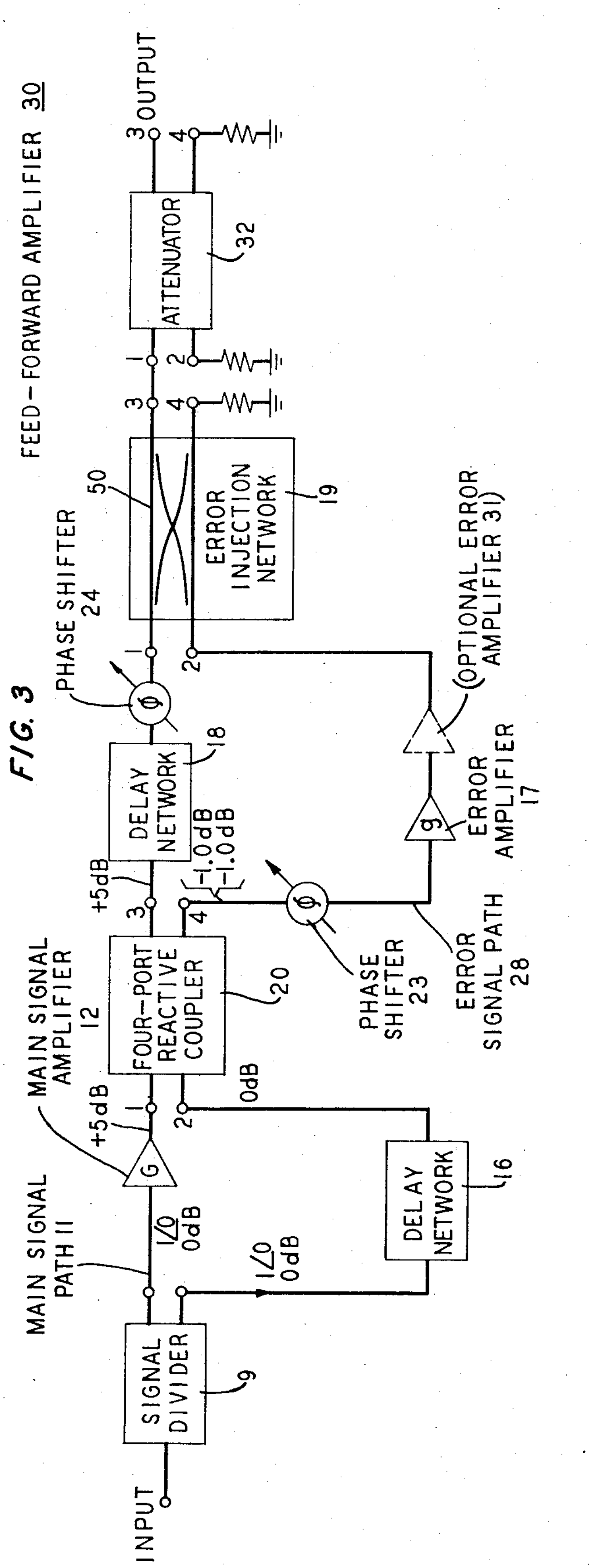
FIG. 3 shows one embodiment of a feed-forward amplifier in accordance with the present invention.

In accordance with the present invention, these competing and inconsistent requirements are avoided by replacing the two couplers 14 and 15 with a single, four-port, reactive coupler 20, as illustrated in feed-forward amplifier 30 shown in FIG. 3. In all other respects the circuits of FIGS. 1 and 2 are essentially the same and, accordingly, the same identification numerals are employed to designate corresponding circuit components.

Before proceeding with a discussion of the operation of the amplifier of FIG. 3, the transmission properties of a four-port, reactive coupler will be briefly reviewed. Designating ports 1–2, and 3–4 as the conjugate pairs of ports, the scattering matrix M of the coupler is given by $$M=\begin{vmatrix} 0 & 0 & S_{13} & S_{14} \\ 0 & 0 & S_{23} & S_{24} \\ S_{31} & S_{32} & 0 & 0 \\ S_{41} & S_{42} & 0 & 0 \end{vmatrix}$$

where the designation $S_{ij}$ denotes the coupling between the $i^{th}$ and the $j^{th}$ port. Since the coupler is a reactive, reciprocal network $S_{ij}=S_{ji}$ and, more particularly, $$|S_{13}|=|S_{31}|=|S_{24}|=|S_{42}|=|t| \quad (1)$$

where $t$ is the coefficient of coupling of the "through" signal component; and $$|S_{14}|=|S_{41}|=|S_{23}|=|S_{32}|=|k| \quad (2)$$

where $k$ is the coefficient of coupling of the "coupled" signal component.

If coupler 20 is, in addition, bisymmetric, the matrix coefficients given by each of Equations 1 and 2 are equal in phase, as well as in magnitude. If the coupler is asymmetric, there will be a phase difference associated with some of the coefficients.

Since, for a reactive four-port $MM^*=1$ (where the asterisk designates the conjugate of the term so marked) it follows that $$S^*_{13}S_{14}+S_{23}S_{24}=0 \quad (3)$$

$$S_{13}S^*_{23}+S_{14}S^*_{24}=0 \quad (4)$$

$$S_{13}S^*_{13}+S_{23}S^*_{23}=1 \quad (5)$$

and, hence, $$|S_{13}|^2+|S_{23}|^2=1 \quad (6)$$

Assuming, for purposes of explanation and illustration, an input signal component of 1/0 in both the main signal path 11 and the reference signal path 13, the amplitudes of the signals at coupler ports 1 and 2 are then G and 1, respectively, where G is the main signal amplifier gain. Neglecting, for the moment, any error component, the signal, $v$, at the input to the error amplifier is $$v=GS_{14}+S_{24} \quad (7)$$

Since the sum of the reference signal and the coupled portion of the amplified signal must equal zero at the input to the error amplifier, the gain G of the signal amplifier 12 is derived by setting Equation 7 equal to zero. This yields $$G=-\left(\frac{S_{24}}{S_{14}}\right) \quad (8)$$

or, from Equation 3

$$G=\left(\frac{S^*_{13}}{S^*_{23}}\right) \quad (9)$$

The amplifier output signal, $V_o$, equal to the sum of the signals coupled to port 3, is given by $$V_o=GS_{13}+S_{23} \quad (10)$$

Substituting for G from Equation 9, we obtain $$V_o=\frac{S^*_{13}}{S^*_{23}}(S_{23})+S_{23} \quad (11)$$

or $$V_o=\frac{S_{13}S^*_{13}+S_{23}S^*_{23}}{S^*_{23}} \quad (12)$$

From Equation 5 the numerator is equal to unity, and Equation 12 reduces to $$|V_o|=\frac{1}{|S^*_{23}|}=\frac{1}{|S_{23}|} \qquad (13)$$

Since a unity input signal was postulated, Equation 13 also defines the overall gain characteristic of the amplifier. It will be noted from Equation 13 that the overall gain of amplifier 30 of FIG. 3 is greater than the overall gain that can be realized from the prior art amplifier shown in FIG. 2 by the factor $$\left|\frac{1}{S_{23}}\right|$$

It will be noted from Equation 13 that the output voltage $V_o$ is a function of the coupler's coefficient of coupling $S_{23}$. Thus, the frequency response of amplifier 30 is determined by the frequency characteristic of coupler 20. Conversely, specifying the desired frequency response of the amplifier defines the coupler characteristic and the gain characteristic of amplifier 12.

The significance of the $S_{23}$ term in the expression for the amplifier output can be more readily appreciated by going through a signal level analysis of the amplifier, similar to that made in connection with FIG. 2. It will be recalled that in the prior art embodiment of FIG. 2 there were two conflicting conditions that had to be satisfied. On one hand, we sought to minimize the signal loss through coupler 14. On the other hand, we sought to cancel a relatively large reference signal by means of that portion of the signal coupled through couplers 14 and 15. As was noted, these two requirements could not be simultaneously satisfied without compromising the overall noise performance of the amplifier.

In the embodiment of FIG. 3, no such compromise results. For example, with a zero db signal applied, as hereinabove, to both the main signal path and the reference signal path, the coupler 20 is designed to couple sufficient signal to cancel the reference signal. With a 5 db gain in the amplifier, a 6 db coupler would produce a —1.0 db signal at port 4 of coupler 20. The reference signal would experience about a 1 db loss in the coupler, also producing a —1.0 db reference signal at port 4. Being equal, the two signals cancel, as required, producing no net signal at the input to error amplifier 17. Since the coupler is a reactive network, there is no absorption of energy within the coupler and, hence, all the energy that was coupled into ports 1 and 2 must, therefore, emerge at port 3. Thus, unlike the prior art amplifier, there is no power lost in the signal sampling network in spite of the fact that a relatively large component of signal is coupled from the main signal path to the error amplifier since an equal amount is coupled into the signal path from the reference path. This ability to couple relatively large signal components into the reference signal path means that correspondingly larger error components are also coupled into the error amplifier. Since it is the noise performance of the error amplifier that ultimately determines the noise performance of the overall amplifier, the present amplifier is a distinct improvement over the prior art amplifier. In fact, as will now be shown, the net noise figure of the amplifier of FIG. 3 is less than the noise figure of the error amplifier.

In the discussion thus far, we have neglected an error component. Generally, however, the output from signal amplifier 12 will be equal to the sum of the amplifier input signal, plus an error component $\epsilon$. Thus, for a unity amplitude input signal, the output V from signal amplifier 12 is, more completely given by $$V=G+\epsilon \qquad (14)$$

At the input to the error amplifier, the signal components cancel, leaving an error component $v_e$, given by $$v_e=\epsilon S_{14} \qquad (15)$$

The amplifier error signal $V_e$ applied to port 2 of the error injection network 19 is then $$V_e=g\epsilon S_{14} \qquad (16)$$

where $g$ is the error amplifier gain.

The error component in the main signal path coupled through coupler 20 to port 1 of the error injection network is $$v_{m\epsilon}=\epsilon S_{13} \qquad (17)$$

Summing $V_e$ and $v_{m\epsilon}$ to zero, we obtain $$g\epsilon S_{14}+\epsilon S_{13}=0 \qquad (18)$$

$$g=-\left(\frac{S_{13}}{S_{14}}\right) \qquad (19)$$

Since $S_{14}=S_{23}$, Equation 19 reduces to $$g=-\left(\frac{S_{13}}{S_{23}}\right) \qquad (20)$$

Comparing Equations 9 and 20, it is noted that the gain characteristic of the error amplifier is the same as the gain characteristic of the main signal amplifier.

Since any thermal noise introduced by signal amplifier 12 is an error component and, hence, is canceled by the error signal injected into the signal path, the only thermal noise in the output signal is that due to thermal noise generated in the input circuit of the error amplifier. Designating this thermal noise power $T_{in}$, the thermal noise power in the error amplifier output is $T_o$, given by $$T_o=T_{in}|g|^2 \qquad (21)$$

Substituting from Equation 20 for $g$ gives $$T_o=T_{in}\frac{|S_{13}|^2}{|S_{23}|^2} \qquad (22)$$

For the unit input signal hereinabove assumed, the total signal power $P_o$ is equal to $|V_o|^2$. Substituting for $V_o$ from Equation 13 gives $$P_o=\frac{1}{|S_{23}|^2} \qquad (23)$$

From Equations 22 and 23, the noise-to-signal ratio in the amplifier output is $$N/S=T_o/V_o^2=T_{in}|S_{13}|^2 \qquad (24)$$

Since $S_{13}$ is always less than unity, the noise content of the output signal, as given by Equation 24, is less than the thermal noise introduced by the error signal amplifier.

As indicated hereinabove, for many applications, the amplifier gain characteristic will not be flat but will be specifically tailored for some particular purpose. In the illustration given in connection with FIG. 1, it was indicated that the gain characteristic of amplifiers 8 would be determined by the loss characteristic of transmission line 7. Thus, if the latter is designated as $A(\omega)$, the gain characteristic $f(\omega)$ of amplifier 8, to produce a flat response at the receiver, is then given by $$f(\omega)=A(\omega) \qquad (25)$$

More generally, however, any arbitrary over-all gain characteristic $F(\omega)$ can be specified, and once specified, amplifier 30 is fully defined. For example, equating Equation 13 to the desired gain characteristic, the coupler parameter $S_{23}$ is given as $$|S_{23}|=\frac{1}{F(\omega)} \qquad (26)$$

(The * may be omitted since it only relates to the phase of the matrix coefficient.)

Knowing $S_{23}$, we derive from Equation 6 that $$|S_{13}|=\sqrt{1-|S_{23}|^2} \qquad (27)$$

thus fully defining the coupler.

From Equations 13 and 20 we obtain for the gain of signal amplifier 12 and error amplifier 17

$$G(\omega)=g(\omega)=\sqrt{F(\omega)^2-1} \qquad (28)$$

It should be noted that all of the relations given hereinabove are based upon equal signals of unit amplitude being applied to the main signal amplifier 11 and the reference signal path 13. However, it was also indicated that in practice the input signal is preferably divided unequally by signal divider 9 and the smaller of the two signal components advantageously coupled into the main signal path. When this is done, the magnitude of the main signal amplifier gain must be multiplied by a constant to accommodate this inequality. Thus, the gain expression given by Equation 9 is more generally given by $$G=K_1\left(\frac{S^*_{13}}{S^*_{23}}\right) \qquad (29)$$

where $K_1$ is a constant.

In a similar fashion, the gain of the error amplifier is more generally given by $$g=K_2\left(\frac{S_{13}}{S_{23}}\right) \qquad (30)$$

where $K_2$ is a constant, and Equation 28 more accurately given by the proportionality $$G(\omega)\alpha g(\omega)\alpha\sqrt{F(\omega)^2-1} \qquad (31)$$

Thus, while the main signal amplifier and the error amplifier have the same gain-frequency characteristic, the absolute gain of the two amplifiers need not necessarily be the same, nor need they necessarily have the same dynamic range and noise properties. Since the error amplifier need only handle a relatively small error signal, its dynamic range can, obviously, be much less than that of the signal amplifier. Similarly, since it is the noise properties of the error amplifier that determines the ultimate noise characteristic of the overall amplifier, the error amplifier advantageously is a much finer amplifier having a relatively low noise figure. In general, the error amplifier is a small, high quality amplifier.

While the coupler has been specified generally in terms of its matrix coefficients $S_{ij}$, no specific circuits have been described. Clearly, no specific circuit can be described since the nature of the coupler will vary, depending upon the overall gain characteristic $F(\omega)$. However, some general comments can be made and an illustrative coupler described.

The simplest couplers are the so-called "hybrid couplers" which can be divided into two general classes. In one class, which includes the "magic tee," the input signal is divided into two components which are either in phase or 180 degrees out of phase. In the second class of couplers, the so-called "quadrature couplers," the divided signal components are always 90 degrees out of phase.

Being reactive, four-ports, both classes of couplers are characterized by two coupling coefficients $t$ and $k$, which vary as a function of frequency. In general, however, they will not necessarily vary in a manner to satisfy Equation 26. It will, therefore, be necessary to devise more complex coupling circuits, as is illustrated, for example, in FIG. 4.

Figure 4:
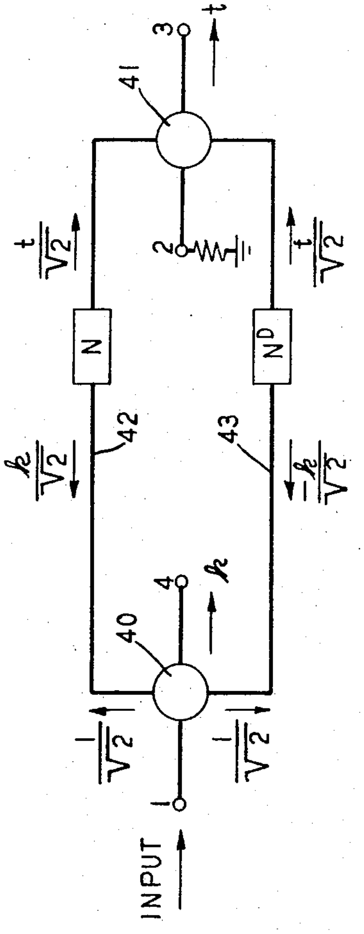
FIG. 4 shows an illustrative embodiment of a class of couplers having a specified power division ratio characteristic.

The coupler illustrated in FIG. 4 is a reactive, four-port comprising a pair of hybrid junctions 40 and 41, interconnected by means of two wavepaths 42 and 43. Wavepath 42 includes a reactive two-port network N whose coefficient of transmission $t(\omega)$ and coefficient of reflection $k(\omega)$ have the required coupling characteristic dictated by Equations 26 and 27. This network can be synthesized in accordance with the techniques disclosed by S. Darlington in his paper entitled "Synthesis of Reactance 4-Poles," published in the Journal of Mathematic Physics, vol. 30, September 1939, pp. 257–353.

The other wavepath also includes a two-pole reactive network $N^D$, which is the dual of network N. As such, it has the same coefficient of transmission $t(\omega)$ as network N, but the coefficient of reflection $-k(\omega)$ is the negative of network N.

In operation, a signal applied at port 1 divides equally between the two wavepaths 42 and 43. For a unit amplitude input signal, the incident signal components in wavepaths 42 and 43 are equal to $$\frac{1}{\sqrt{2}}$$

A portion $$\frac{t}{\sqrt{2}}$$

of each signal component is transmitted by networks N and $N^D$, and recombined in hybrid 41 to produce an output signal $t$ at port 3. The other portion of each signal is reflected by networks N and $N^D$ to produce two reflected signal components $$\frac{k}{\sqrt{2}}$$

and $$-\frac{k}{\sqrt{2}}$$

These combine in hybrid 40 to produce an output signal $k$ at port 4, thus realizing the required coupler characteristic. Clearly, other coupling networks can just as readily be devised by those skilled in the art.

In my copending application Ser. No. 692,546, filed Dec. 27, 1967, the problems associated with attempting to inject an error signal into a main signal path handling large amounts of power were considered. The conflicting requirements imposed upon the error injection network were resolved by using an N:1 turns ratio transformer connected, as illustrated in FIG. 2, with the error amplifier coupled to the high turns side, and the low turns side connected in series with the main signal path. This connection has the effect of placing the main signal path in series with the output circuit. As such, it has the disadvantage of requiring a good match in the main signal path so as to avoid spurious reflections. In situations where this can be done or is of little consequence, the transformer error injection circuit of FIG. 2 can also be employed in the embodiment of the invention shown in FIG. 3.

In those applications requiring a higher degree of impedance match, the alternative arrangement shown in FIG. 3 is to be preferred. In this embodiment, the error injection network 19 comprises a hybrid coupler 50. The signal from the main signal path is coupled to port 1 of coupler 50 and the error signal to port 2. The error-corrected output signal is extracted from port 3. Port 4 is resistively terminated.

To minimize signal losses due to coupling between input port 1 and the terminated port 4, a coupler having a larger power division ratio (of the order of 10 db) that is flat over the frequency range of interest, would be used. To compensate for the corresponding loss in the error signal being injected into the main signal path, the gain of the error amplifier must be correspondingly increased, or a separate amplifier 31, having a flat gain characteristic, is included in the error signal path. Being an optimal element, it is shown in broken line in FIG. 3.

It will be noted from Equations 9 and 13 that the gain of amplifier 12, given by $$\left|\frac{S_{13}}{S_{23}}\right|$$

is less than the gain $$\frac{1}{S_{23}}$$

of the over-all amplifier 30 by the factor $S_{13}$. In some applications it may be preferable that the over-all amplifier gain be the same as the gain of the main signal amplifier. In such a situation, an attenuator 32 is added to the circuit at the output of the error injection network 19. However, it will be noted that to equate the overall gain to the signal amplifier gain the attenuator must have the same coupling coefficient $S_{13}$ as coupler 20. Accordingly, the required attenuation over the band of interest is most conveniently realized by adding a second coupler, having the same coupling characteristics as coupler 20, at the output of the amplifier, thereby modifying the over-all gain of the amplifier by the factor $S_{13}$. Ports 2 and 4 of the coupler are resistively terminated.

The invention has been described with reference to an amplifier whose gain varies as an arbitrary function of frequency. It will be understood that the term "arbitrary function of frequency" includes amplifiers having gain characteristics that are independent of frequency (i.e., flat over the frequency range of interest) as well as amplifiers having gain characteristics which are frequency dependent over the frequency range of interest. It will also be noted that either the main signal amplifier or the error amplifier, or both, can themselves be feed-forward amplifiers. Such multiple loop arrangements are more fully described in applicant's above-identified copending application. Accordingly, the terms "main signal amplifier" and "error amplifier" shall be understood to include amplifiers of all varieties, including feed-forward amplifiers of the type described herein. Thus, it is understood that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

I claim:

1. A feed-forward electromagnetic wave amplifier having an arbitrary gain-frequency characteristic $F(\omega)$ comprising:

first and second parallel wavepaths;

the first of said wavepaths including, in cascade, a main signal amplifier and a first delay network;

the second of said wavepaths including, in cascade, a second delay network and an error amplifier;

means for dividing an input electromagnetic wave into two signal components, and for coupling a different one of said components to the input end of each of said wavepaths;

means for coupling a portion of the output from said main signal amplifier to the input of said error amplifier;

and output means for recombining in an output circuit the signals in said two wavepaths in time and phase to minimize error components in the output signal;

characterized in that:

said coupling means is a reactive network having two pairs of conjugate ports and having a transmission coefficient $|t|$ and a coupling coefficient $|k|$ between coupled ports, where $|k^2|+|t^2|=1$;

said main signal amplifier and said second delay network are coupled, respectively, to one pair of conjugate ports of said coupler, and said first delay network and said error amplifier are coupled, respectively, to the other pair of conjugate ports of said coupler;

the gain characteristic $G(\omega)$ of said main amplifier and the gain characteristic $g(\omega)$ of said error amplifier are given by $$G(\omega)\alpha g(\omega)\alpha\sqrt{F(\omega)^2-1}$$

and in that $$|k|\alpha\frac{1}{F(\omega)}$$

2. The feed-forward amplifier according to claim 1 wherein said dividing means divides said input signal into two unequal components and couples the larger of said components into said second wavepath.

3. The feed-forward amplifier according to claim 1 wherein said output means comprises an N:1 turns ratio transformer;

and wherein said second wavepath is coupled to the high turns side and the low turns side is coupled in series with said first wavepath and said output circuit.

4. The feed-forward amplifier according to claim 1 wherein said output means is a hybrid coupler.

5. A feed-forward electromagnetic wave signal amplifier having a gain-frequency characteristic $F(\omega)$ comprising:

an input signal divider for dividing the signal to be amplified into two components;

means for coupling one of said components to a signal amplifier having a gain-frequency characteristic $$G(\omega)\alpha\sqrt{F(\omega)^2-1}$$

means for coupling the other of said components to a first time delay network;

a reactive coupling network having two pairs of conjugate ports, characterized by a coefficient of transmission $t$ and a coefficient of coupling $k$, such that $|k|$ is proportional to $$\frac{1}{F(\omega)}$$

and $|t^2|+|k^2|=1$ means for coupling the output from said signal amplifier to one port of one of said pairs of conjugate ports;

means for coupling the output from said first delay network to the other port of said one pair of ports;

means for coupling one port of said other pair of conjugate ports to a second time delay network;

means for coupling the other port of said other pair of conjugate ports to an error amplifier having a gain-frequency characteristic $g(\omega)$ proportional to $$\sqrt{F(\omega)^2-1}$$

output means for combining the output from said error amplifier and said second delay line in a common output circuit;

and means for adjusting the phase of the signals along said wavepaths so as to minimize the distortion in the amplified output signal produced by said feed-forward amplifier.

6. A feed-forward electromagnetic wave amplifier having an arbitrary gain-frequency characteristic $F(\omega)$ comprising:

first and second parallel wavepaths;

the first of said wavepaths including, in cascade, a main signal amplifier and a first delay network;

the second of said wavepaths including, in cascade, a second delay network and an error amplifier;

means for dividing an input electromagnetic wave into two signal components, and for coupling a different one of said components to the input end of each of said wavepaths;

means, comprising a reactive network having a coefficient of transmission $|t|$ and a coefficient of coupling $|k|$, where $|k^2|+|t^2|=1$, for coupling a portion of the output from said main amplifier to the input of said error amplifier;

output means for combining the signals in said two wavepaths in a common output circuit in time and phase to minimize error components in the resulting output signal;

and an attenuator connected in series with said output means;

characterized in that:

the gain characteristic $G(\omega)$ of said main amplifier, the gain characteristic $g(\omega)$ of said error amplifier, and the ratio $$\frac{t}{k}$$

are proportional to $F(\omega)$;

and in that said attenuator has an attenuation characteristic proportional to $|t|$.

7. The feed-forward amplifier according to claim 6 wherein said attenuator is a reactive four-port having the same coefficient of transmission as said coupling means.

References Cited

UNITED STATES PATENTS 2,592,716 4/1952 Lewis ------------ 330—151 X

ROY LAKE, Primary Examiner

J. B. MULLINS, Assistant Examiner

U.S. Cl. X.R.

330—149, 151